US012597477B2

(12) United States Patent
Sha

(10) Patent No.: US 12,597,477 B2
(45) Date of Patent: Apr. 7, 2026

(54) DETECTION OF LEAKAGE CURRENT IN FLASH MEMORY

(71) Applicant: Yangtze Memory Technologies Co., Ltd., Wuhan (CN)

(72) Inventor: Guanyu Sha, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 259 days.

(21) Appl. No.: 18/307,690

(22) Filed: Apr. 26, 2023

(65) Prior Publication Data

US 2024/0363179 A1     Oct. 31, 2024

(51) Int. Cl.
*G11C 16/34*     (2006.01)
*G11C 16/08*     (2006.01)
*G11C 16/10*     (2006.01)
(52) U.S. Cl.
CPC .......... *G11C 16/3459* (2013.01); *G11C 16/08* (2013.01); *G11C 16/102* (2013.01)
(58) Field of Classification Search
CPC ... G11C 16/3459; G11C 16/08; G11C 16/102; G11C 2029/1202; G11C 2029/5006; G11C 11/5628; G11C 5/145; G11C 16/0483; G11C 16/10; G11C 16/30; G11C 16/3418
See application file for complete search history.

(56) References Cited

U.S. PATENT DOCUMENTS

| | | | |
|---|---|---|---|
| 2019/0006019 A1* | 1/2019 | Wang | G11C 16/08 |
| 2019/0051351 A1* | 2/2019 | Pyo | G11C 29/028 |
| 2021/0057032 A1* | 2/2021 | Kurosawa | G11C 16/3481 |
| 2021/0398602 A1* | 12/2021 | Lakshminarayana Addagalla | G11C 16/0483 |
| 2022/0383966 A1* | 12/2022 | Huang | G11C 16/30 |
| 2023/0060971 A1* | 3/2023 | You | G11C 29/025 |

OTHER PUBLICATIONS

Standard cell article (Year: 2022) archived on WaybackMachine Jun. 17, 2022 <https://web.archive.org/web/20220617123939/ https://en.wikipedia.org/w/index.php?title=Standard_cell>.*

* cited by examiner

*Primary Examiner* — Alexander Sofocleous
*Assistant Examiner* — James S Wells
(74) *Attorney, Agent, or Firm* — Fish & Richardson P.C.

(57)     ABSTRACT

Example memory devices, memory systems, methods, and media for detection of leakage current in a memory device are disclosed. One example method includes performing a program operation of the memory device. A voltage over a combination of one or more resistors is compared with a preset threshold during the program operation, where the one or more resistors are positioned between a pump source and a global word line in the memory device. It is determined that the voltage is larger than or equal to the preset threshold. In response to the determination that the voltage is larger than or equal to the preset threshold, it is indicated that a leakage current exist in a word line coupled to a memory cell in the memory device.

20 Claims, 14 Drawing Sheets

1000 ⟶

1100

1200

1202 — PGM PL0 and PL1, WL0

1204 — READ STATUS SR6 FAILS
DUE TO SA SENSING

1206 — SWITCH TO SINGLE PL PGM

1208 — PREPARE DATA 111/11/1 IN PL0
TO TRIGGER PGM INHIBIT

1210 — PGM PL0, WL0, READ STATUS SR6

1212 — PREPARE DATA 111/11/1 IN PL1
TO TRIGGER PGM INHIBIT

1214 — PGM PL1, WL0, READ STATUS SR6

1216 — MARK THE BLOCK, DEPENDS
ON EACH PLANE'S SR6 STATUS

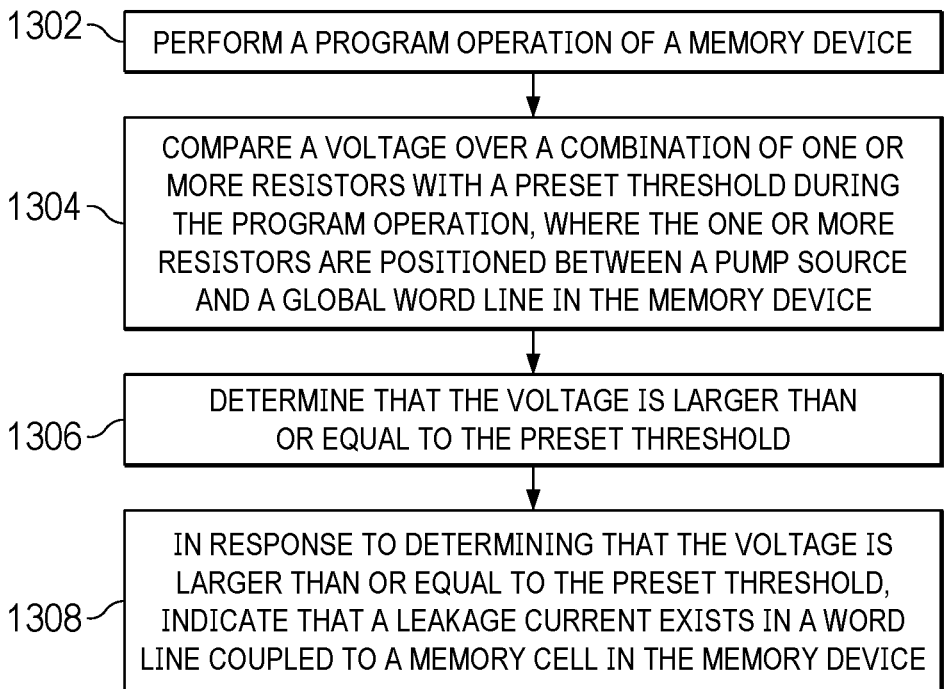

1302 — PERFORM A PROGRAM OPERATION OF A MEMORY DEVICE

1304 — COMPARE A VOLTAGE OVER A COMBINATION OF ONE OR MORE RESISTORS WITH A PRESET THRESHOLD DURING THE PROGRAM OPERATION, WHERE THE ONE OR MORE RESISTORS ARE POSITIONED BETWEEN A PUMP SOURCE AND A GLOBAL WORD LINE IN THE MEMORY DEVICE

1306 — DETERMINE THAT THE VOLTAGE IS LARGER THAN OR EQUAL TO THE PRESET THRESHOLD

1308 — IN RESPONSE TO DETERMINING THAT THE VOLTAGE IS LARGER THAN OR EQUAL TO THE PRESET THRESHOLD, INDICATE THAT A LEAKAGE CURRENT EXISTS IN A WORD LINE COUPLED TO A MEMORY CELL IN THE MEMORY DEVICE

DETECTION OF LEAKAGE CURRENT IN FLASH MEMORY

TECHNICAL FIELD

The present disclosure relates to memory devices, memory systems, methods, and media for detection of leakage current in flash memory.

BACKGROUND

Flash memory is a low-cost, high-density, nonvolatile solid-state storage medium that can be electrically erased and reprogrammed. Flash memory includes NOR flash memory and NAND flash memory. Various operations can be performed by flash memory, for example, read, program (write), and erase operations, to change the threshold voltage of each memory cell to a respective level. For NAND flash memory, an erase operation can be performed at the block level and a program operation can be performed at the page level.

SUMMARY

The present disclosure involves memory devices, memory systems, methods, and media for detection of leakage current in a memory device, for example, NAND flash memory. One example method includes performing a program operation of the memory device. A voltage over a combination of one or more resistors is compared with a preset threshold during the program operation, where the one or more resistors are positioned between a pump source and a global word line in the memory device. It is determined that the voltage is larger than or equal to the preset threshold. In response to the determination that the voltage is larger than or equal to the preset threshold, it is indicated that a leakage current exist in a word line coupled to a memory cell in the memory device.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

FIG. 13 illustrates an example of a flow chart of a method for detecting leakage current in a memory device, according to some aspects of the present disclosure.

Like reference numbers and designations in the various drawings indicate like elements.

DETAILED DESCRIPTION

This specification relates to memory devices, memory systems, methods, and media for detection of leakage current in NAND flash memory. In some cases, during the program (write) operation of a block of memory cells in some memory devices, such as NAND flash memory devices, a program operation that goes from the bottom word line of the block to the top word line of the block can be performed. In some cases, a reverse program operation that goes from the top word line to the bottom word line of the block can be performed. If a word line, for example, a bottom word line, has burned out during the reverse program operation, it can cause leakage current in some of the word lines of the memory cells that are close to this word line and that have been programmed. The leakage current can cause uncorrectable error correction code (UECC) due to read fail in some of the word lines of the memory cells that are close to this word line. The leakage current of a word line can also cause program fail of the remaining word lines in the block during the reverse program operation. However, the existence of the leakage current is not reported by the programming status indicator of the memory devices.

In some implementations, a current detector can be used to detect leakage current during the reverse program operation discussed previously. The current detector can be positioned between a pump source that provides voltage supplies to a memory cell array that includes the block and the global word line of the memory cell array. Because the global word line is coupled to a word line of each block in the memory cell array, and a leakage current in a word line of the block being programmed can lead to a current in the global word line after the charging of the global word line is completed, the current detector can detect the leakage current in the word line of the block. This approach can be used to identify blocks that have word lines with leakage current, and thus prevent these blocks from being used for program operations, as using these blocks for program operations can lead to data loss of a memory device.

Figure 1:
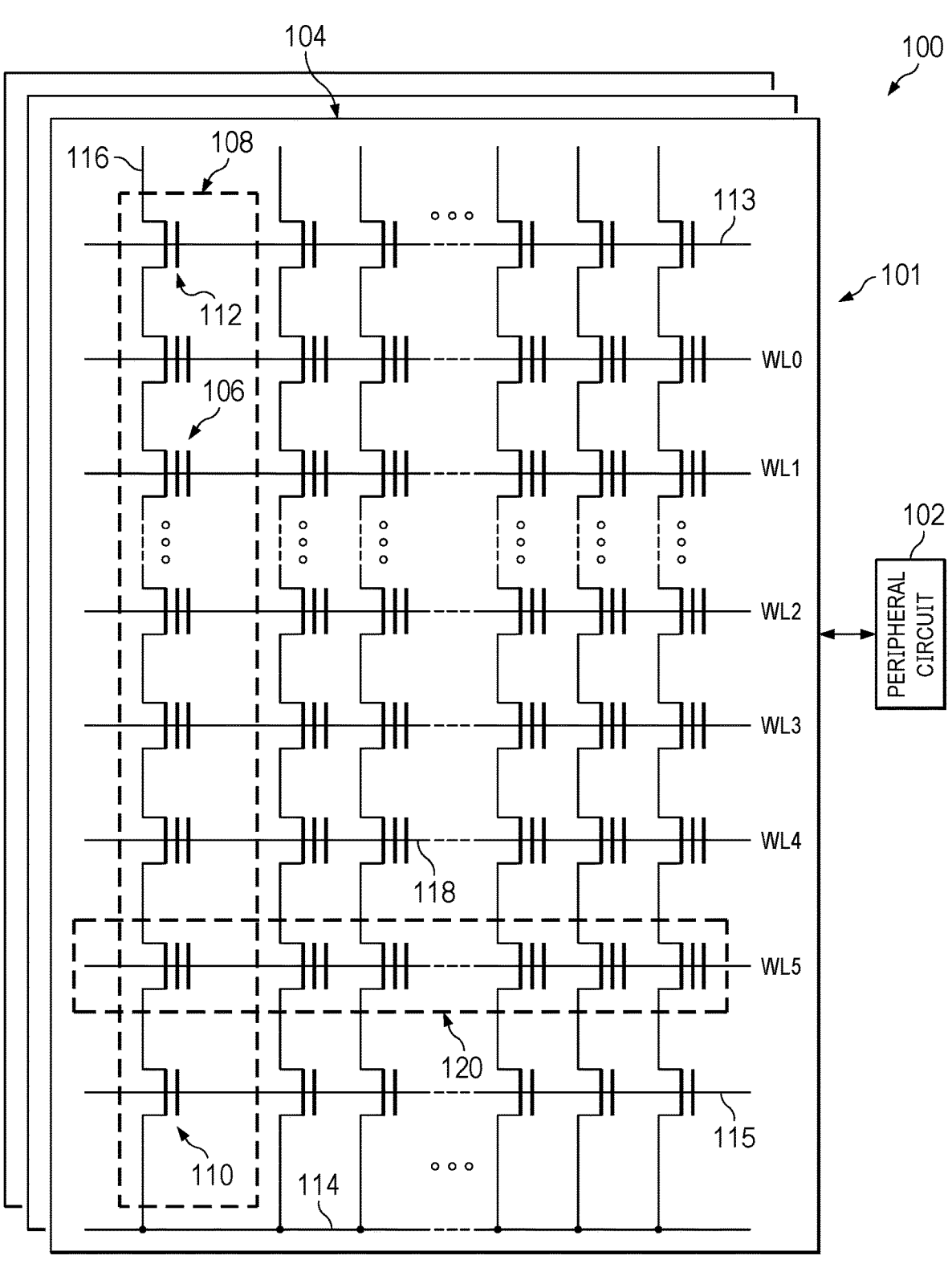
FIG. 1 illustrates an example of a schematic diagram of a memory device including peripheral circuits, according to some aspects of the present disclosure.

FIG. 1 illustrates an example of a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of NAND memory strings 108 each extending vertically above a substrate (not shown). In some implementations, each NAND memory string 108 includes a plurality of memory cells 106 coupled in series and stacked vertically. Each memory cell 106 can hold a continuous, analog value, such as an electrical voltage or charge that depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1 each NAND memory string 108 can include a source select gate (SSG) 110 at its source end and a drain select gate (DSG) 112 at its drain end. SSG 110 and DSG 112 can be configured to activate selected NAND memory strings 108 (columns of the array) during read and program operations. In some implementations, the sources of NAND memory strings 108 in the same block 104 are coupled through a same source line (SL) 114, e.g., a common SL. In other words, NAND memory strings 108 in the same block 104 have an array common source (ACS), according to some implementations. DSG 112 of each NAND memory string 108 is coupled to a respective bit line 116 from which data can be read or written via an output bus (not shown), according to some implementations. In some implementations, each NAND memory string 108 is configured to be selected or deselected by applying a select voltage (e.g., above the threshold voltage of the transistor having DSG 112) or a deselect voltage (e.g., 0 V) to respective DSG 112 through one or more DSG lines 113, and/or by applying a select voltage (e.g., above the threshold voltage of the transistor having SSG 110) or a deselect voltage (e.g., 0 V) to respective SSG 110 through one or more SSG lines 115. In some implementations, NAND memory string 108 includes the bottom memory cell abutted SSG 110 and the top memory cell abutted DSG 112, where the bottom memory cell is coupled to the bottom word line, for example, WL5 shown in FIG. 1, and the top memory cell is coupled to the top word line, for example, WL0 shown in FIG. 1.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a selected block 104, source lines 114 coupled to selected block 104 as well as unselected blocks 104 in the same plane as selected block 104 can be biased with an erase voltage (Vers), such as a high positive voltage (e.g., 20 V or more). In some examples, erase operation may be performed at a half-block level, a quarter-block level, or a level having any suitable number of blocks or any suitable fractions of a block. Memory cells 106 of adjacent NAND memory strings 108 can be coupled through word lines 118 that select which row of memory cells 106 is affected by read and program operations. In some implementations, each word line 118 is coupled to a page 120 of memory cells 106, which is the basic data unit for program operations. The size of one page 120 in bits can relate to the number of NAND memory strings 108 coupled by word line 118 in one block 104. For case of description, memory cells 106 in one page 120 may be coupled to a same word line 118, and the terms "page" and "word line" may be used interchangeably in the present disclosure. However, in some examples, memory cells 106 in one page 120 may be coupled to more than one word line 118, or memory cells 106 coupled to the same word line 118 may be grouped into at least one page 120. Each word line 118 can include a plurality of control gates (gate electrodes) at each memory cell 106 in respective page 120 and a gate line coupling the control gates. Example word lines shown in FIG. 1 include top word line WL0, WL1, WL2, WL3, WL4, and bottom word line WL5 that are between one or more DSG lines 113 and one or more SSG lines 115.

Figure 2:
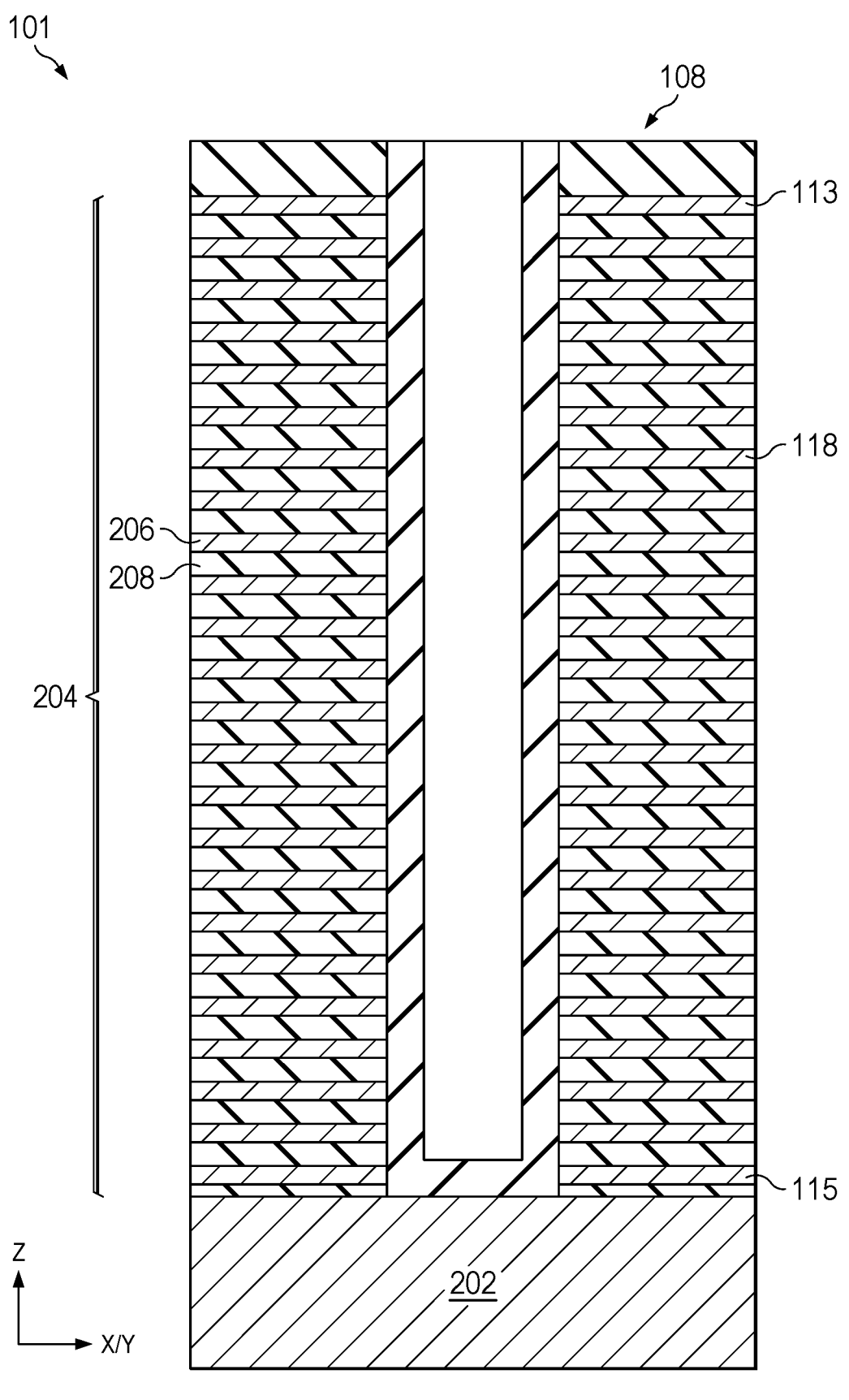
FIG. 2 illustrates an example of a side view of cross-sections of a memory cell array including NAND memory strings, according to some aspects of the present disclosure.

FIG. 2 illustrates an example of a side view of cross-sections of a memory cell array 101 including NAND memory strings 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding memory cells 106, DSG 112, or SSG 110, and can extend laterally as DSG line 113 at the top of memory stack 204, SSG line 115 at the bottom of memory stack 204, or word line 118 between DSG line 113 and SSG line 115.

As shown in FIG. 1, consistent with the scope of the present disclosure, since a program operation is performed at the page/word line level for each block 104, each block 104 can be either an open block or a full block depending on whether all pages in respective block 104 have all been programmed. In some implementations, block 104 is an open block if at least one page 120 in block 104 is not programmed, i.e., memory cells 106 in at least one page 120 in block 104 are in the erased state. For example, an open block may include one or more unprogrammed pages. In some implementations, block 104 is a full block if all pages 120 in block 104 are programmed, i.e., memory cells 106 in all pages 120 in block 104 are in the programmed states. For example, a full block may not include any unprogrammed page.

Figure 3:
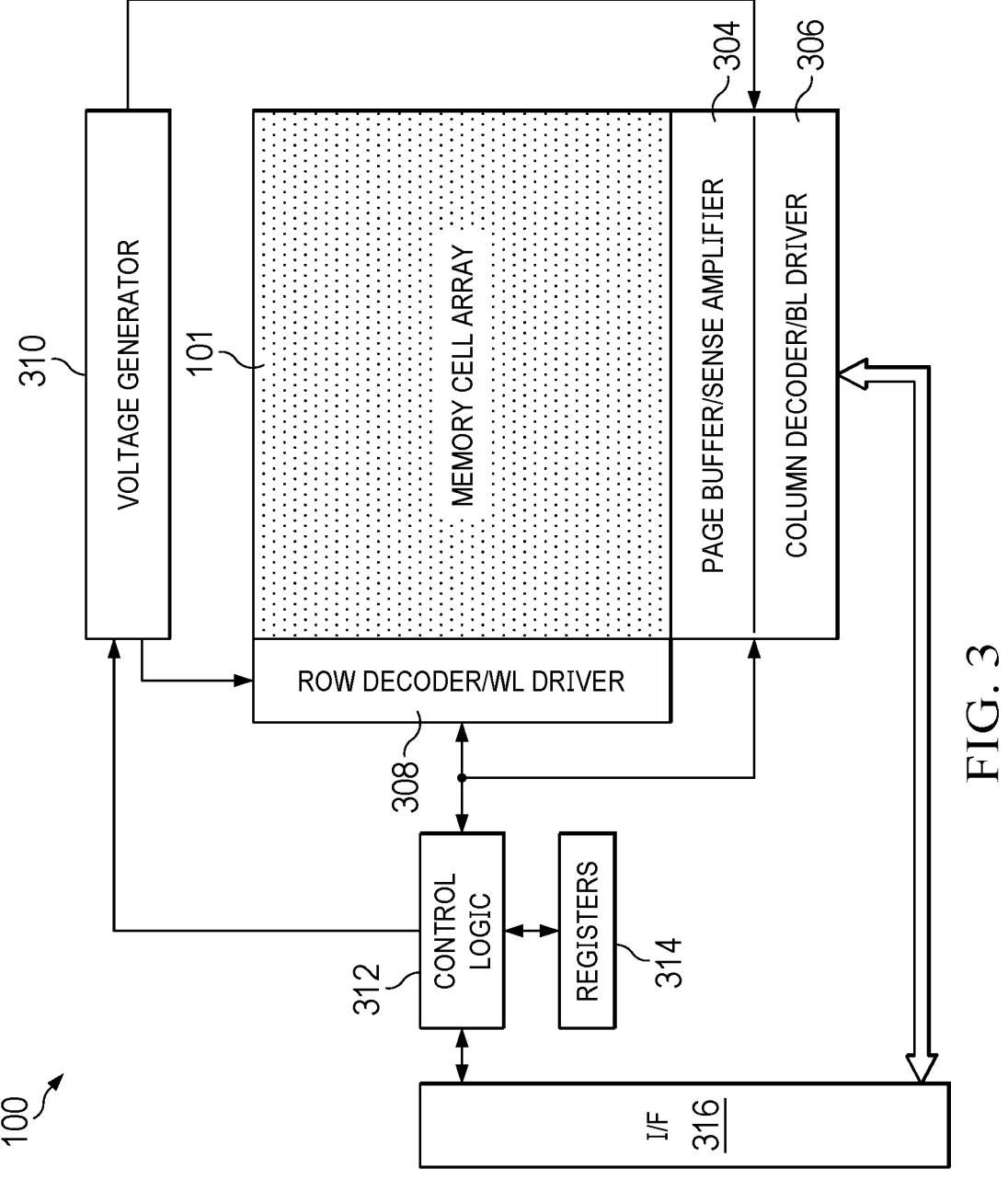
FIG. 3 illustrates an example of a schematic diagram of a peripheral circuit, according to some aspects of the present disclosure.

Peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each target memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies. For example, FIG. 3 illustrates some example peripheral circuits, according to some aspects of the present disclosure. The example peripheral circuits include a page buffer/sense amplifier 304, a column decoder/bit line driver 306, a row decoder/word line driver 308, a voltage generator 310, control logic 312, registers 314, an interface 316, and a data bus. In some examples, additional peripheral circuits not shown in FIG. 3 may be included as well.

Page buffer/sense amplifier 304 can be configured to read and program (write) data from and to memory cell array 101 according to the control signals from control logic 312. In one example, page buffer/sense amplifier 304 may store one page of program data (write data) to be programmed into one page 120 of memory cell array 101. In another example, page buffer/sense amplifier 304 may perform program verify operations to ensure that the data has been properly programmed into memory cells 106 coupled to selected word lines 118. In still another example, page buffer/sense amplifier 304 may also sense the low power signals from bit line 116 that represents a data bit stored in memory cell 106 and amplify the small voltage swing to recognizable logic levels in a read operation. Column decoder/bit line driver 306 can be configured to be controlled by control logic 312 and select one or more NAND memory strings 108 by applying bit line voltages generated from voltage generator 310.

Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive SSG lines 115 and DSG lines 113 as well. As described below in detail, row decoder/word line driver 308 is configured to apply a read voltage to selected word line 118 in a read operation on memory cell 106 coupled to selected word line 118.

Voltage generator 310 can be configured to be controlled by control logic 312 and generate the word line voltages (e.g., read voltage, program voltage, pass voltage, local voltage, verification voltage, etc.), bit line voltages, and source line voltages to be supplied to memory cell array 101.

Control logic 312 can be coupled to each peripheral circuit described above and configured to control operations of each peripheral circuit. Registers 314 can be coupled to control logic 312 and include status registers, command registers, and address registers for storing status information, command operation codes (OP codes), and command addresses for controlling the operations of each peripheral circuit. As described below in detail, the status registers of registers 314 can include one or more registers configured to store open block information indicative of the open block(s) of all blocks 104 in memory cell array 101, such as having an ADSV list. In some implementations, the open block information is also indicative of the last programmed page of each open block.

Interface 316 can be coupled to control logic 312 and act as a control buffer to buffer and relay control commands received from a host (not shown) to control logic 312 and status information received from control logic 312 to the host. Interface 316 can also be coupled to column decoder/bit line driver 306 via a data bus and act as a data input/output (I/O) interface and a data buffer to buffer and relay the data to and from memory cell array 101.

Figure 4:
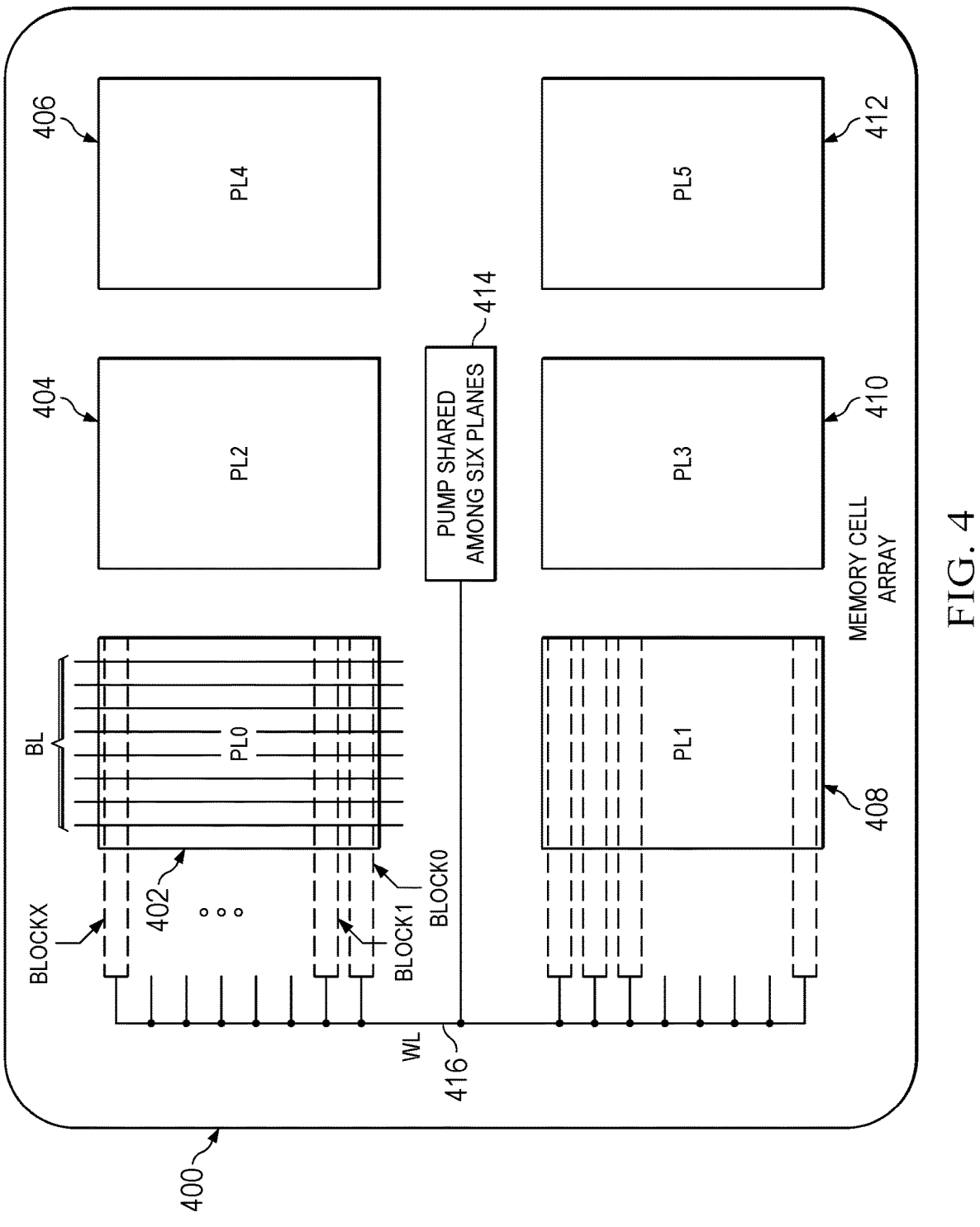
FIG. 4 illustrates an example of a schematic diagram of multiple planes of memory cells in a memory device, according to some aspects of the present disclosure.

FIG. 4 illustrates an example of a schematic diagram 400 of multiple planes of memory cells in a memory device, according to some aspects of the present disclosure. The multiple planes share a pump 414 through a global word line 416. As shown in FIG. 4, six planes in a memory device, PL0 402, PL1 408, PL2 404, PL3 410, PL4 406, and PL5 412, share the same pump 414 through a common global word line 416. Each of the six planes can have multiple blocks of memory cells. For example, PL0 402 has block0, block1 . . . , and blockx, as illustrated in FIG. 4. When a word line corresponding to a block in one of the six planes has leakage current during the programming of the six planes and after global word line 416 is charged, global word line 416 commonly shared by the six planes and coupled to pump 414 also has a current due to the leakage current at the word line corresponding to the block. This current on the commonly shared global word line 416 can be detected using one or more SA current detectors coupled to the commonly shared global word line between pump 414 and the six planes. In some implementations, pump 414 can correspond to voltage generator 310 in FIG. 3.

Figure 5:
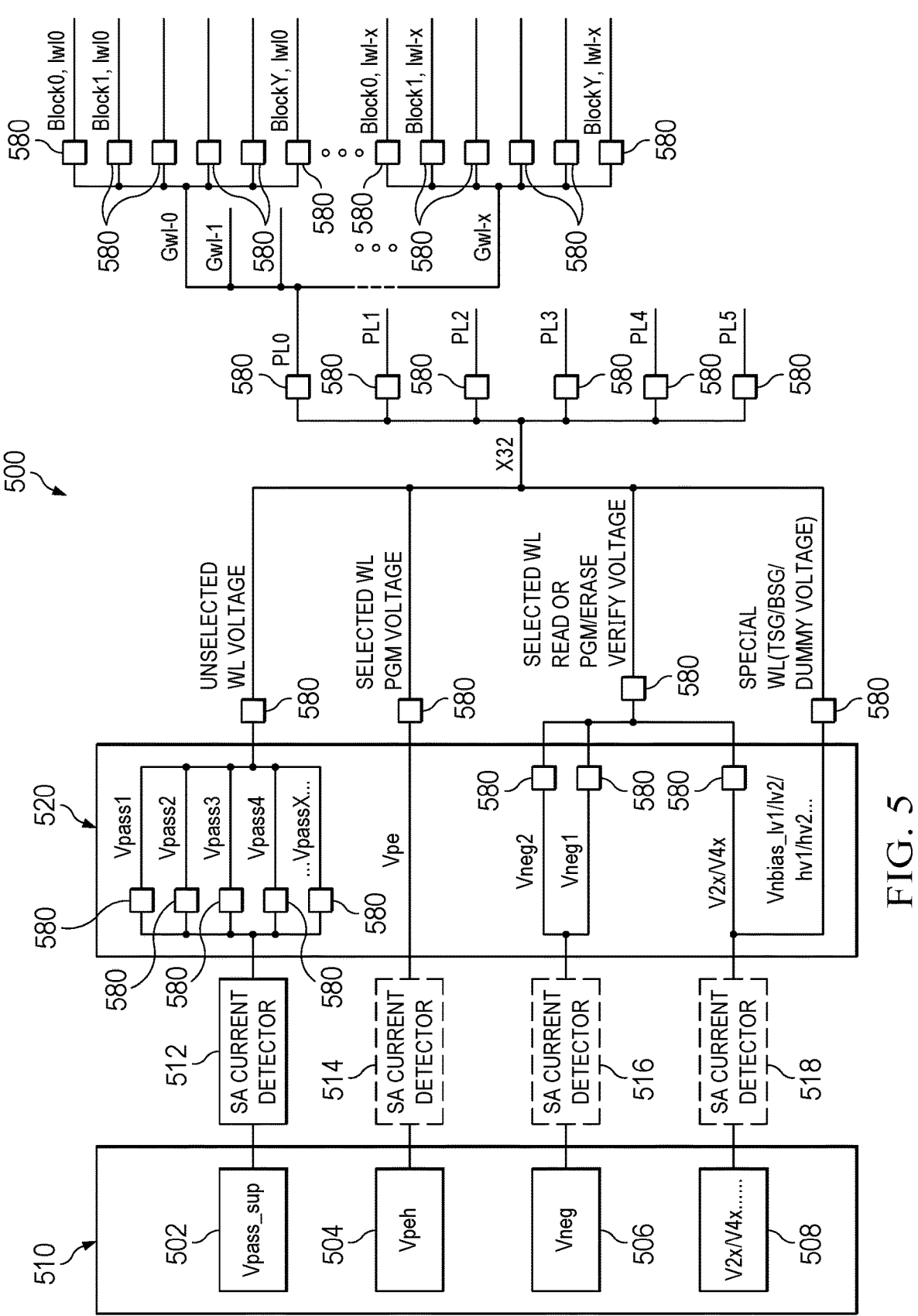
FIG. 5 illustrates an example of a schematic diagram for detecting leakage current in a block of multiple planes of a memory device, according to some aspects of the present disclosure.

FIG. 5 illustrates an example of a schematic diagram 500 for detecting leakage current in a block of one of six planes PL0 to PL5 when programming the six planes, according to some aspects of the present disclosure. A global word line X32 is shared by the six planes and connects the six planes to multiple voltage supplies in a pump source 510. The multiple voltage supplies include Vpass_sup 502, Vpeh 504, Vneg 506, and V2x/V4x 508. Switches 580 can be used to select a voltage supply for a particular word line. In some implementations, pump source 510 can correspond to voltage generator 310 in FIG. 3.

In some implementations, an SA current detector 512 can be positioned between the voltage supply Vpass_sup 502 and the global word line X32 to detect leakage current in a block of one of the six planes PL0 to PL5 when the six planes are programmed. A regulator module 520 can be positioned between the one or more SA current detectors 512, 514, 516, or 518 and the global word line X32 to select voltages to be applied to different word lines in the blocks of the six planes.

In some implementations, regulator module 520 can select a voltage from multiple voltages Vpass1, Vpass2 . . . , and VpassX that are provided by voltage supply Vpass_sup 502. The selected voltage can be applied to a word line coupled to a page of memory cells not selected for programming.

In some implementations, regulator module 520 can select a voltage Vpe provided by voltage supply Vpeh 504. The selected voltage can be applied as a programming voltage to a word line coupled to a page of memory cells selected for programming.

In some implementations, regulator module 520 can select a voltage from Vneg1 and Vneg2 provided by voltage supply Vneg 506 and V2x/V4x provided by voltage supply 508. The selected voltage can be applied as a verify voltage to a word line coupled to a page of memory cells selected for program verify operation or erase verify operation, or as a read voltage to a word line coupled to a page of memory selected for read operation.

In some implementations, regulator module 520 can select a voltage Vbias_lv1/lv2/hv1/hv2 provided by voltage supply 508. The selected voltage can be applied as a voltage to a word line coupled to a top select gate transistor (TSG), a bottom select gate transistor (BSG), or a dummy memory cell.

In some implementations, one or more SA current detectors 514, 516, or 518 can also be positioned between the global word line X32 and one or more voltage supplies 504, 506, or 508 respectively to detect current in global word line X32 that is due to leakage current in a block of one of six planes PL0 to PL5 when programming the six planes.

Figure 6:
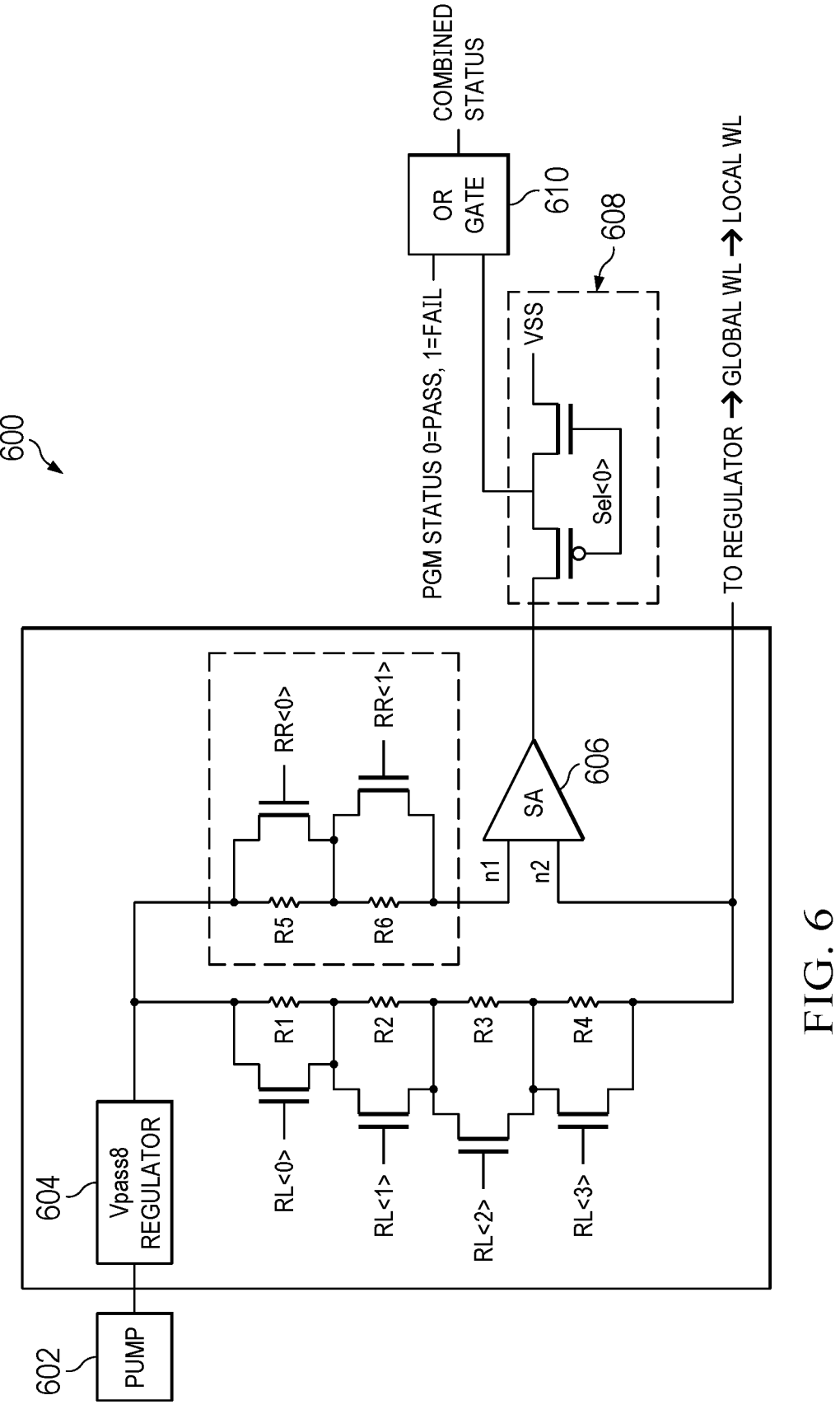
FIG. 6 illustrates an example of a peripheral circuit of a memory device for SA current detection, according to some aspects of the present disclosure.

FIG. 6 illustrates an example of a peripheral circuit 600 of a memory device for SA current detection, according to some aspects of the present disclosure. Peripheral circuit 600 can be part of peripheral circuit 102 of memory device 100 in FIG. 1, and can be used to detect leakage current in a word line coupled to a memory cell of a memory cell array, for example, memory cell array 101, during the incremental step pulse programming (ISPP) phase when programming a memory cell in a block of memory cells in one of multiple planes of a memory device.

In some implementations, peripheral circuit 600 (e.g., leakage detection circuit) can include a first resistor circuit that has multiple resistors, for example, R1 to R4, and multiple transistors RL<3:0> corresponding to R1 to R4 respectively. Peripheral circuit 600 can include a second resistor circuit that has multiple resistors, for example, R5 and R6, and multiple transistors RR <1:0> corresponding to R5 and R6 respectively. Peripheral circuit 600 can also include SA 606 (e.g., first logic) that can be configured to output a signal indicating a current leakage status, where the current leakage status indicates whether a leakage current exists in a word line coupled to a memory cell of a memory cell array, for example, memory cell array 101. The multiple transistors RL<3:0> can be used to select a combination of resistors in R1 to R4 that are used to generate the resistance value between Vpass8 regulator 604 and the input end n2 of SA 606. The multiple transistors RL<3:0> and RR<1:0> can be N-type metal-oxide-semiconductor (NMOS) transistors or p-type metal-oxide semiconductor (PMOS) transistors. Resistors R1 to R4 are connected in series in FIG. 6. R1 to R4 can also be connected in parallel. Resistors R5 and R6 are connected in series in FIG. 6. R5 and R6 can also be connected in parallel.

In some implementations, leakage current in a word line coupled to a page in a block of memory cells (e.g., word line lwl0 coupled to a page in block 0 in FIG. 5) can lead to current in a global word line (e.g., X32 in FIG. 5) that is coupled to the word line. The global word line is also coupled to the input end n2 of SA 606 through a regulator module (e.g., regulator module 520 in FIG. 5). The current in the global word line can pass through a combination of resistors in R1 to R4 and can cause the voltage at the input end n1 of SA 606 to be different than the voltage at the input end n2 of SA 606. SA 606 can then be used to compare the voltage between its input ends n1 and n2, which can also be the voltage over the combination of R1 to R4 when R5 and R6 are bypassed, with a preset threshold to determine whether the current in the global word line is large enough to indicate that the word line coupled to the global word line has leakage current. In some cases, the current in the global word line can flow from R1 to R4 and cause the voltage at the input end n1 of SA 606 to be higher than the voltage at the input end n2 of SA 606.

In some implementations, resistors R1 to R4 can form 16 different combinations of resistance values through the control of RL<3:0>. These combinations of resistance values can be used with SA 606 to detect current on a global word line (e.g., X32 in FIG. 5) shared by multiple planes (e.g., PL0 to PL5 in FIGS. 4 and 5), where the current is due to leakage current on a work line of a block in the multiple planes.

Figure 7:
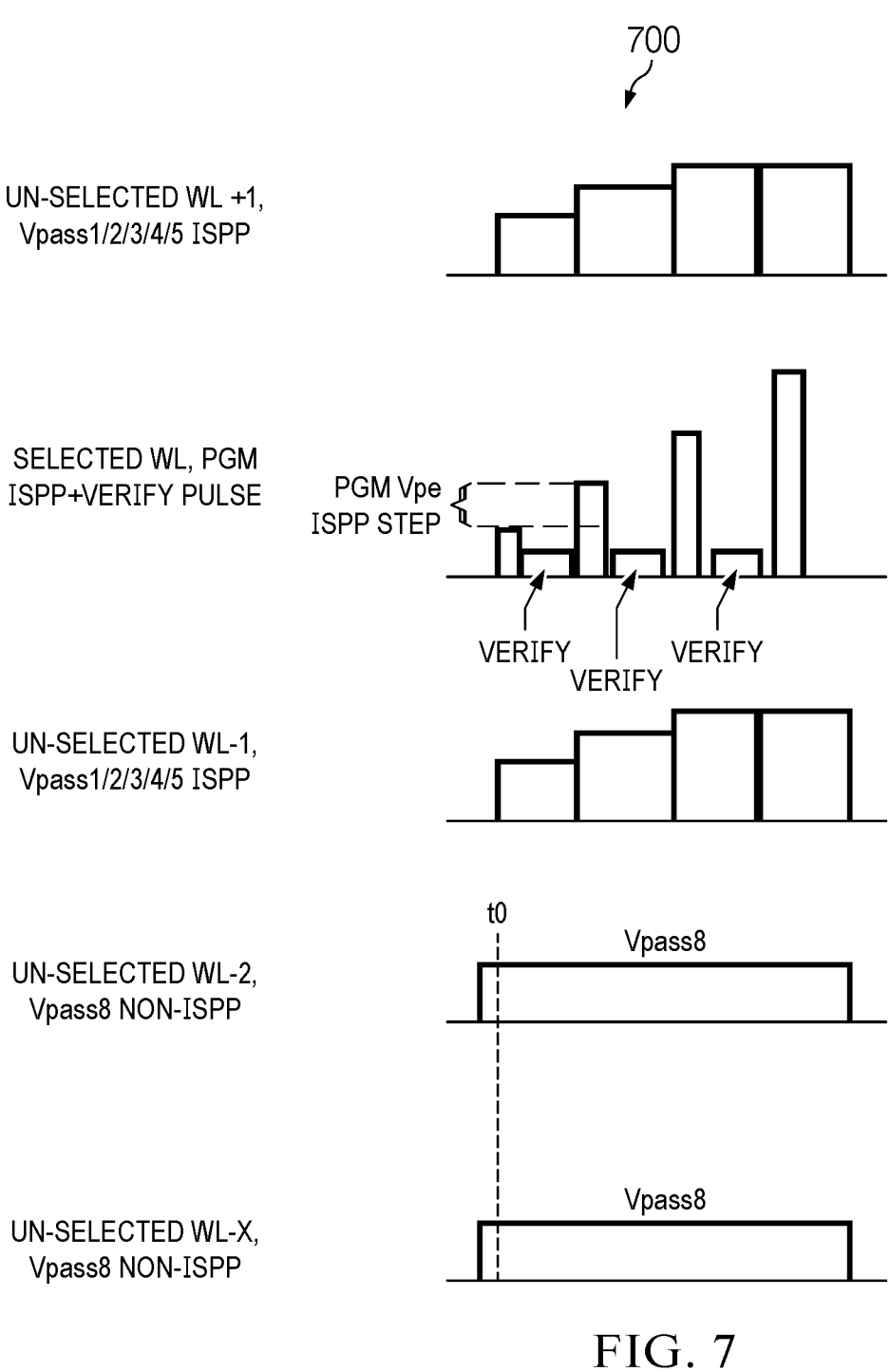
FIG. 7 illustrates an example of pulses applied to word lines in a memory device, according to some aspects of the present disclosure.

In some implementations, a voltage regulator, for example, Vpass8 regulator 604, can be positioned between pump 602 and the first resistor circuit to select a stable voltage provided by pump 602, for example, Vpass8 (e.g., first voltage) that is applied to an unselected word line coupled to a page of memory cells not selected for programming, during the ISPP of a page of memory cells. The unselected word line can be two or more levels above or below the work line coupled to the page of memory cells being programmed, as shown in FIG. 7 and described later. Pump 602 can correspond to pump source 510 in FIG. 5. In some implementations, as shown in FIG. 5, Vpass8 can be first provided to the global word line X32 through switch 580 for unselected WL voltage, before it is provided to an unselected word line.

In some implementations, after the global word line shared by the multiple planes is charged and the current in the global word line is stable, for example, after a variation of the current in the global word line during a preset period of time is less than a preset value, SA 606 compares the voltage between its input ends n1 and n2, which is equivalent to the voltage over the combination of resistors in R1 to R4 when resistors R5 and R6 are bypassed using RR<1:0>, with a preset threshold to generate a logic state 0 or 1 as an output from SA 606. If the voltage between n1 and n2 is larger than or equal to the preset threshold, the output of SA 606 is logic state 1, indicating that there is leakage current in a word line of a block of one of the multiple planes that share the global word line. If the voltage between n1 and n2 is less than the preset threshold, the output of SA 606 is logic state 0, indicating that there is no leakage current in word lines of any blocks of the multiple planes that share the global word line. For example, if the combination of resistance values of R1 to R4, with the control of RL<3:0>, is 5 k ohm, the preset threshold can be set to 50 mV to detect a current of 50 mA on the global word line as an indication that a leakage current occurred in a word line of a block of one of the multiple planes.

In some implementations, resistors R5 and R6 can be positioned between Vpass8 regulator 604 and input end n1 of SA 606 to reduce the voltage at n1, and thus reduce the voltage difference between n1 and n2. With the control of transistors RR<1:0>, the combination of resistance values of R5 and R6 can be set to a preset threshold value of resistance in order to reduce the risk of false alarm of the occurrence of leakage current.

In some implementations, leakage current in a word line coupled to a page of memory cells that are being programmed (e.g., during an ISPP operation) can cause the voltages of the adjacent word lines respectively coupled to pages of memory cells that are not being programmed to increase, and therefore, the voltage at the input end n2 of SA 606, which is coupled to a global word line (e.g., X32 in FIG. 5) through a regulator module (e.g., regulator module 520 in FIG. 5), can increase, such that the voltage at the input end n1 of SA 606 is lower than the voltage at the input end n2 of SA 606. SA 606 can then be used to compare the voltage between its input ends n1 and n2, which can also be the voltage over the combination of R1 to R4 when R5 and R6 are bypassed, with a preset threshold to determine whether the current in the global word line is large enough to indicate that the word line coupled to the global word line has leakage current.

In some implementations, the output of SA 606 can be connected to an input of OR gate 610 (e.g., second logic) to generate a combined programming status. The other input end of OR gate 610 is configured to receive a signal indicating a programming status. The programming status indicates whether the program operation is successful. If the programming status indicates a failure of the program operation or if the output of SA 606 indicates that a leakage current exists, then the combined programming status from the output of OR gate 610 is logic state 1 which indicates that the program operation fails.

In some implementations, a logic 608 (e.g. third logic) can be positioned between the output of SA 606 and an input of OR gate 610 to select whether to bypass the output of SA 606, and the input of OR gate 610 is determined based on a preset value, for example, logic state 0 or logic state 1. In some implementations, when the preset value is logic state 0, the input of OR gate 610 is the output of SA 606. When the preset value is logic state 1, the input of OR gate 610 is logic state 0, regardless of the output of SA 606.

FIG. 7 illustrates an example 700 of pulses applied to word lines in a memory device, according to some aspects of the present disclosure. In some implementations, during incremental step pulse programming (ISPP) of a memory cell selected for programming, for the word line of the memory cell, also called a selected word line, there is a voltage difference between consecutive ISPP pulses, shown as PGM Vpe ISPP step in FIG. 7. Therefore, the voltage applied to the selected word line is not stable during ISPP. In contrast, a word line of a memory cell that is not selected for programming, also called an unselected word line, can have stable voltage, for example, Vpass8 (e.g., first voltage) in FIG. 7, if the unselected word line is two or more levels above or below the selected work line. Therefore, a current detector can be coupled to the voltage supply that provides voltages for these unselected word lines, for example, the Vpass8 regulator 604 in FIG. 6, in order to detect leakage current, for example, at t0, during the time period when the first ISPP pulse is applied to the selected word line and after global word line X32 in FIG. 5 is charged and the current in global word line X32 is stable, for example, after a variation of the current in the global word line during a preset period of time is less than a preset value.

In some implementations, the voltage (e.g., second voltage) applied to the selected word line during the verify phases of a program operation is stable. Therefore, a current detector can be coupled to the voltage supply that provides the voltage for the verify phases, for example, Vpass_sup 502 in FIG. 5, in order to detect leakage current, for example, during the first verify pulse of the selected word line shown in FIG. 7 and after global word line X32 in FIG. 5 is charged and the current in global word line X32 is stable, for example, after a variation of the current in the global word line during a preset period of time is less than a preset value. In some implementations, Vpass_sup (the second voltage) can be provided to a global word line during a pro9gram verify operation.

Figure 8:
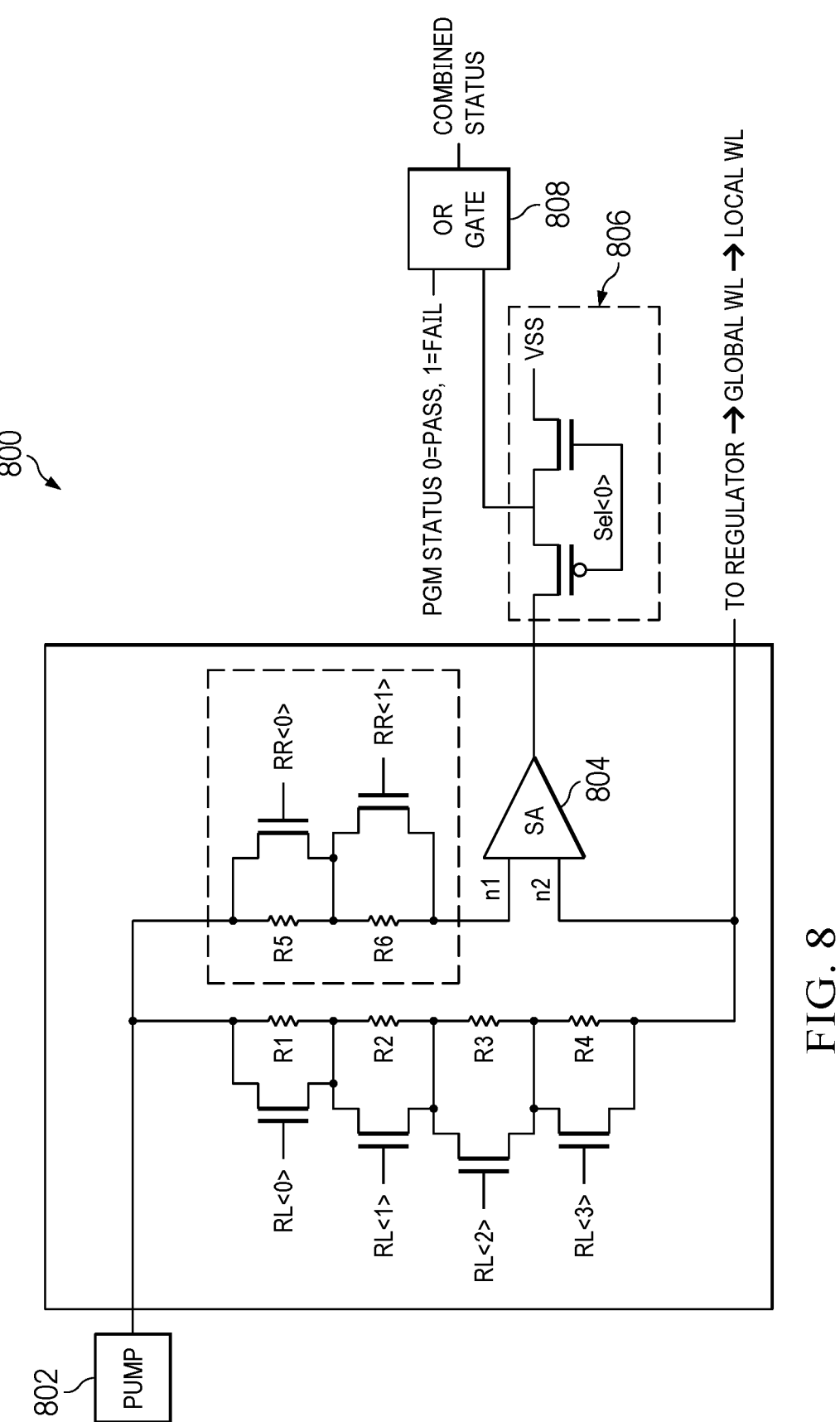
FIG. 8 illustrates another example of a peripheral circuit of a memory device for SA current detection, according to some aspects of the present disclosure.

FIG. 8 illustrates another example of a peripheral circuit 800 of a memory device for SA current detection, according to some aspects of the present disclosure. Peripheral circuit 800 can be used to detect leakage current during the verify phases of program operations. Comparing to FIG. 6, the first resistor circuit that includes the combination of resistors in R1 to R4 in FIG. 8 can be directly coupled to pump 802 that corresponds to pump 602 in FIG. 6, because unlike the leakage current detection in FIG. 6, here in FIG. 8, Vpass8 is no longer needed for leakage current detection. Instead, the voltage from voltage supply Vpass_sup 502 is monitored by SA 606 for detection of leakage current during the verify phases of program operations. The combination of resistors R5 and R6 in FIG. 8 can also be directly coupled to pump 802 and the first resistor circuit that includes the combination of resistors R5 and R6. Additionally, similar to FIG. 6, here in FIG. 8 the first resistor circuit that includes the combination of resistors in R1 to R4 is coupled to a global word line.

Figure 9:
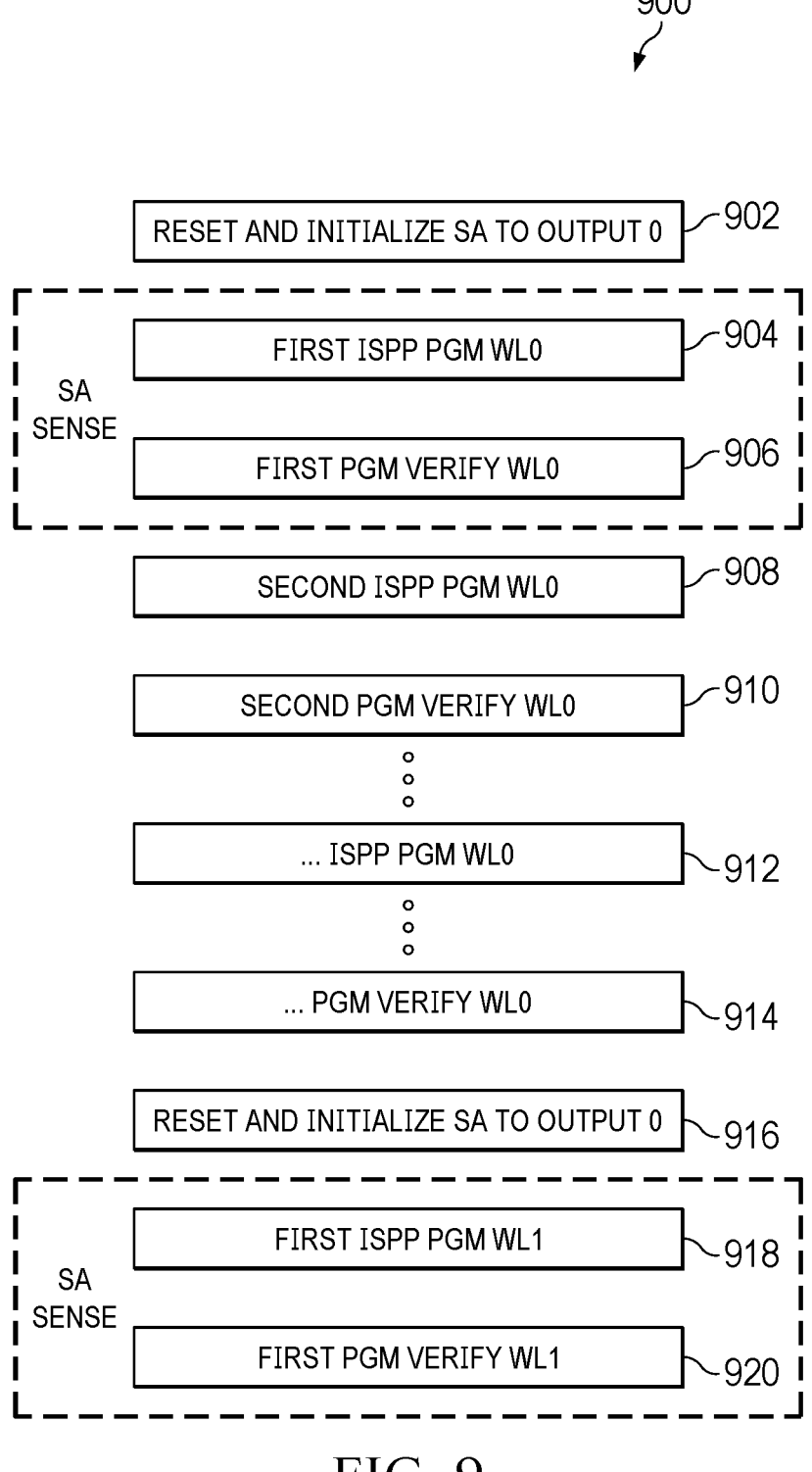
FIG. 9 illustrates an example of a flow chart for detecting leakage current in a block of memory cells of a memory device, according to some aspects of the present disclosure.

FIG. 9 illustrates an example of a flow chart 900 for detecting leakage current in a block of memory cells of a memory device, according to some aspects of the present disclosure. At 902, SA 606 is reset and initialized to output logic state 0 to prepare for the detection of leakage current in the block when voltage pulses are applied to the first word line, e.g., top word line WL0. At 904, SA 606 monitors the current between Vpass8 regulator 604 and the input end n2 of SA 606 to detect whether leakage current exists in the block by detecting whether leakage current exists during the first ISPP pulse for WL0.

At 906, SA 606 monitors the current between Vpass_sup 502 from pump 602 and the input end n2 of SA 606 to detect whether leakage current exists in the block by detecting whether leakage current exists during the first program verify pulse for WL0. Leakage current detection is not performed during the remaining pulses for ISPP or program verify phases of WL0, for example, in steps 908 through 914. At 916, SA 606 is reset and initialized to output logic state 0 to prepare for the detection of leakage current in the block when voltage pulses are applied to the second word line, e.g., WL1. At 918, similar to 904, SA 606 detects whether leakage current exists in the block by detecting whether leakage current exists during the first ISPP pulse for WL1. At 920, similar to 906, SA 606 detects whether leakage current exists in the block by detecting whether leakage current exists during the program verify pulse for WL0. Leakage current detection is not performed during the remaining pulses for ISPP or program verify phases of WL1. The aforementioned leakage current detection can be repeated when voltage pulses are applied to other word lines in the memory device.

Figure 10:
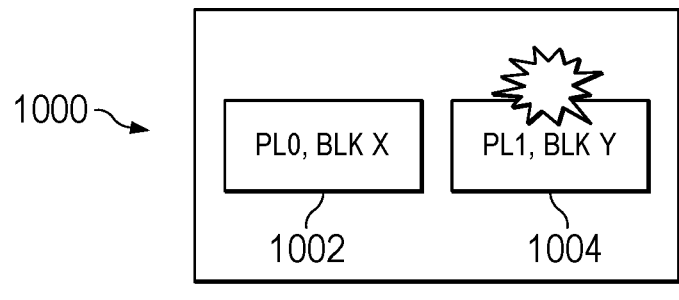
FIG. 10 illustrates an example of a leakage current event in a block of one of two planes, according to some aspects of the present disclosure.

FIG. 10 illustrates an example 1000 of a leakage current event in a block of one of two planes, according to some aspects of the present disclosure. A block in one of the two planes, e.g., blk x in PL0, does not have leakage current during programming of blk x. In contrast, a block in the other plane, e.g., blk y in PL1, has leakage current during programming of blk y. Therefore a mechanism can be used to determine which plane has a block with leakage current when the block is being programmed.

Figure 11:
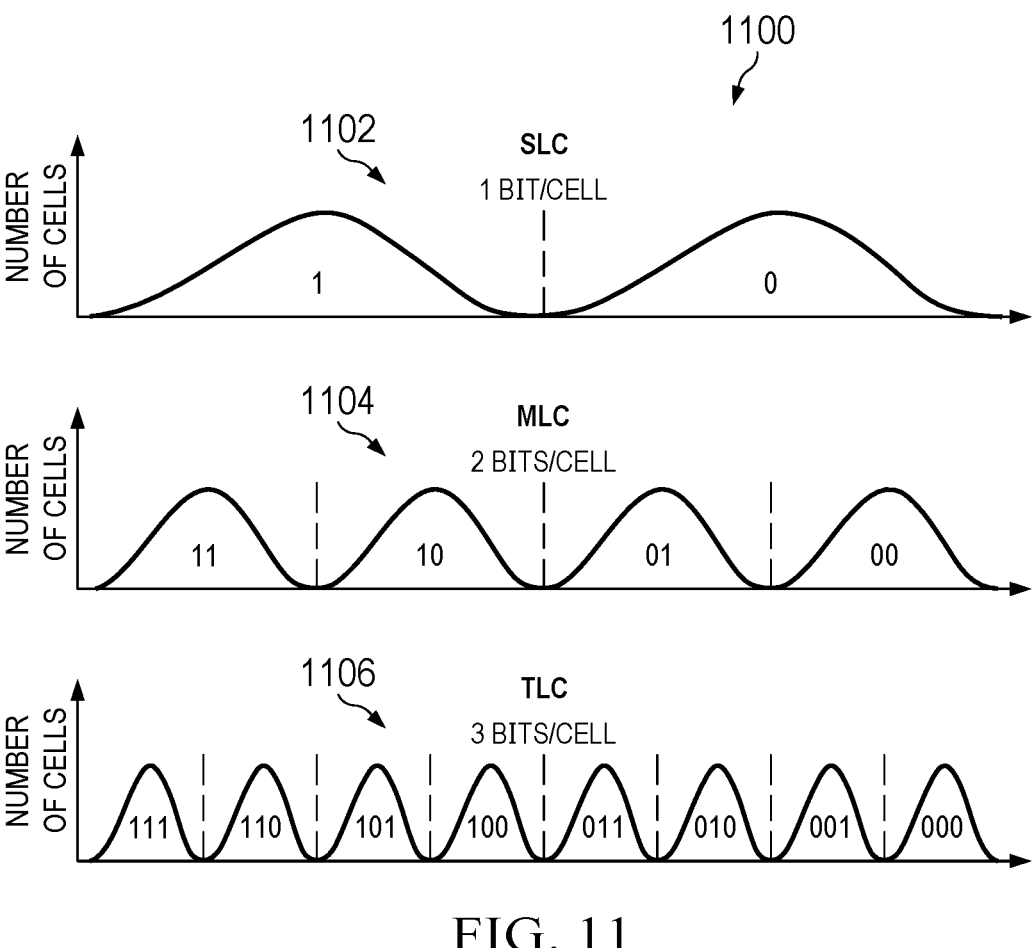
FIG. 11 illustrates an example of threshold voltage distribution associated with data stored in three types of memory cells.

FIG. 11 illustrates an example 1100 of threshold voltage distribution associated with data stored in three types of memory cells, according to some aspects of the present disclosure. The first type of memory cell is a single level cell (SLC) which stores one bit of information. In SLC, 1 represents erase state and 0 represents programming state. The second type of memory cell is a multi-level cell (MLC) which stores two bits of information. In MLC, data bits '11' represents erase state and the other three combinations of 0 and 1 represent 3 programming states. The third type of memory cell is a tri-level cell (TLC) which stores three bits of information. In TLC, data bits '111' represents erase state and the other seven combinations of 0s and 1s represent programming states. The data bits representing the erase state in each of the three memory cells can be used for leakage current detection, as described next.

Figure 12:
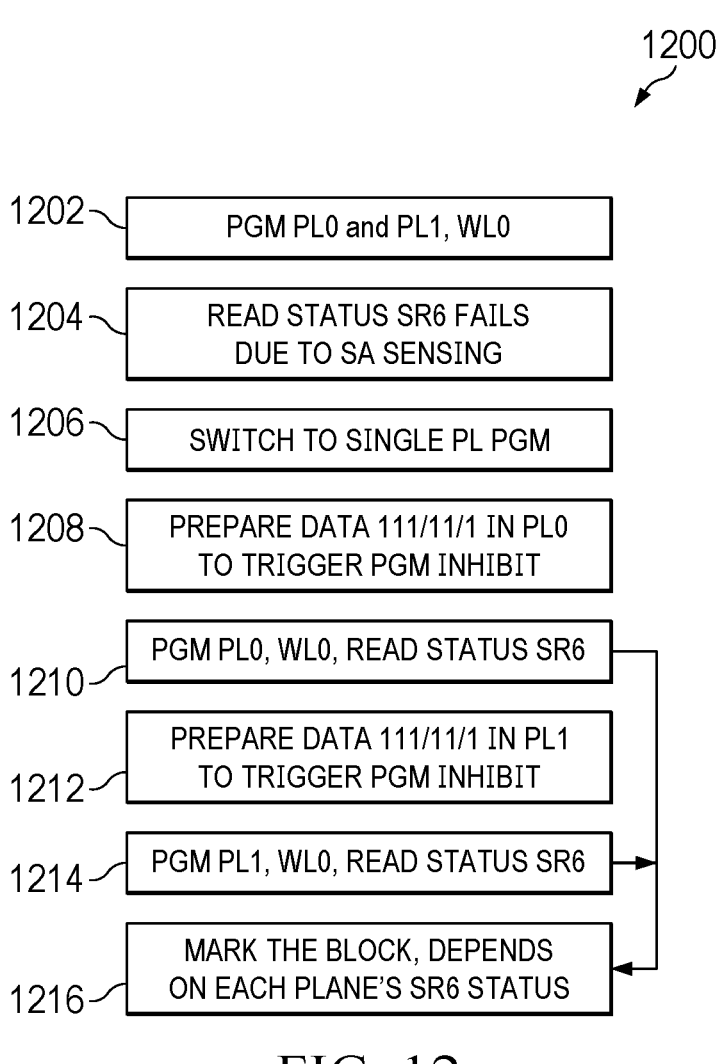
FIG. 12 illustrates an example of a flow chart of commands from a controller for detecting leakage current in a memory device, according to some aspects of the present disclosure.

FIG. 12 illustrates an example of a flow chart 1200 of commands from a controller for detecting leakage current in a memory device, according to some aspects of the present disclosure. In some implementations, the controller can be coupled to the memory device. At 1202, the controller initiates a program operation for planes PL0 and PL1 in FIG. 10, starting from word line WL0 in each plane. At 1204, in response to initiating the program operation, the controller receives a signal by reading a status from a register, for example, SR6. The status can indicate that the program operation fails due to leakage current detected in one or more word lines in one or more memory cell arrays of at least one of the two planes. For example, the combined status from OR gate 610 in FIG. 6 can be sent to SR6 to indicate that leakage current is detected in at least one of the two planes PL0 and PL1.

At 1206, in response to the status indicating that leakage current exists in at least one of the two planes, the controller switches to programming of one plane at a time using preset data value. At 1208, the controller prepares data (e.g., preset data value) for erase state of each memory cell in PL0, depending on the type of memory cells in PL0. As described in FIG. 11, data for erase state is 1, 11, and 111 for SLC, MLC, and TLC respectively. Because erase state is generated after the verify phase, leakage current detection during verify phases according to, for example, FIG. 9, is ensured for each block of PL0.

At 1210, the controller initiates programming of WL0 in PL0 and reads the status from the register that has the status of leakage current detection, for example, SR6. If the status indicates that leakage current exists in WL0 of PL0, the controller determines that leakage current exists in a block containing word line WL0 in plane PL0 and marks, at 1216, the block containing word line WL0 in plane PL0 as not usable because leakage current exists in the block during the program operation of the block. Otherwise the controller continues, at 1212, to prepare data for erase state of each memory cell in PL1.

At 1214, the controller initiates programming of WL0 in PL1 and reads the status from the register that has the status of leakage current detection, for example, SR6. If the status indicates that leakage current exists in WL0 of PL1, the controller determines that leakage current exists in a block containing word line WL0 in plane PL1 and marks, at 1216, the block containing WL0 in PL1 as the block having leakage current. The information marking the block having leakage current can be stored in a register accessible by the controller or in a register in peripheral circuit 102.

In some implementations, after determining that the leakage current exists in a block and before step 1216 of marking the block as not usable, the controller sends a signal to the memory device to move data from the block to another block of the memory cell array.

In some implementations, the block marked by the controller as not usable is a bad block and cannot be used in future program or read operations of the memory cell array that includes the bad block.

FIG. 13 illustrates an example of a flow chart of a method for detecting leakage current in a memory device, according to some aspects of the present disclosure.

At 1302, a program operation is performed.

At 1304, a voltage over a combination of one or more resistors is compared with a preset threshold during the program operation, where the one or more resistors are positioned between a pump source and a global word line in the memory device.

At 1306, it is determined that the voltage is larger than or equal to the preset threshold.

At 1308, in response to the determination that the voltage is larger than or equal to the preset threshold, it is indicated that a leakage current exist in a word line coupled to a memory cell in the memory device.

Figure 14:
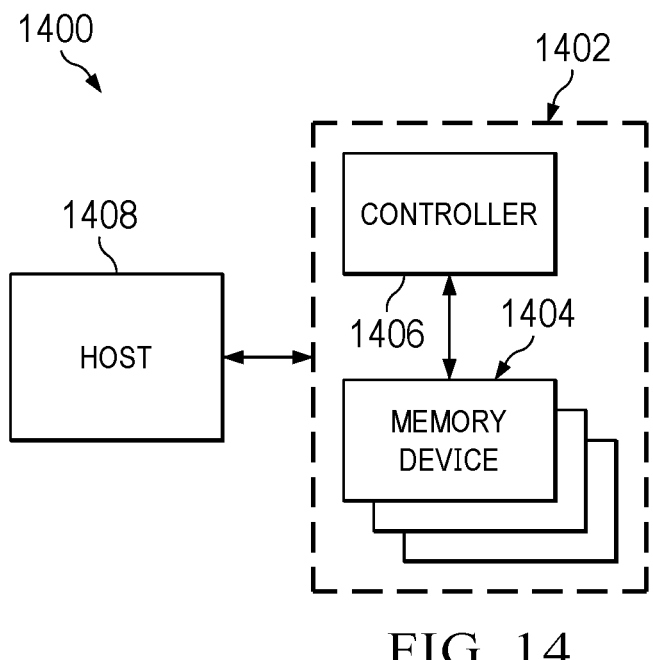
FIG. 14 illustrates a block diagram of an example system having a memory device, according to some aspects of the present disclosure.

FIG. 14 illustrates an example of a block diagram of system 1400 having a memory device, according to some aspects of the present disclosure. System 1400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 14, system 1400 can include a host 1408 and a memory system 1402 having one or more memory devices 1404 and a memory controller 1406. Host 1408 can be a processor of an electronic device, such as a central processing unit (CPU), or a system-on-chip (SoC), such as an application processor (AP). Host 1408 can be configured to send or receive data to or from memory devices 1404. In some implementations, a memory device in the one or more memory devices 1404 can include a leakage detection circuit, for example, peripheral circuit 600 in FIG. 6 or peripheral circuit 800 in FIG. 8, for detecting leakage current in a word line coupled to a memory cell of a memory cell array in the memory device. An example of memory controller 1406 in memory system 1402 can be the controller described in the description of FIG. 12.

Memory device 1404 can be any memory device disclosed in the present disclosure. Memory controller 1406 is coupled to memory device 1404 and host 1408 and is configured to control memory device 1404, according to some implementations. Memory controller 1406 can manage the data stored in memory device 1404 and communicate with host 1408. In some implementations, memory controller 1406 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1406 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1406 can be configured to control operations of memory device 1404, such as read, erase, and program operations. Memory controller 1406 can also be configured to manage various functions with respect to the data stored or to be stored in memory device 1404 including, but not limited to bad-block management, garbage collection, logical-to-physical address conversion, wear leveling, etc. In some implementations, memory controller 1406 is further configured to process error correction codes (ECCs) with respect to the data read from or written to memory device 1404. Any other suitable functions may be performed by memory controller 1406 as well, for example, formatting memory device 1404.

Memory controller 1406 can communicate with an external device (e.g., host 1408) according to a particular communication protocol. For example, memory controller 1406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 15A:
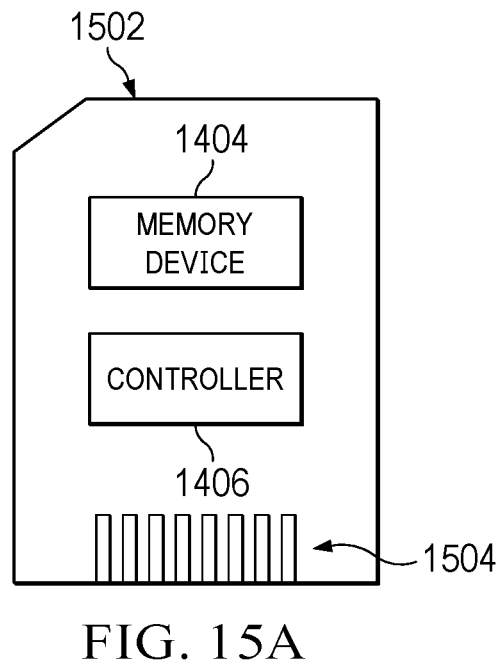
FIG. 15A illustrates a diagram of a memory card having a memory device, according to some aspects of the present disclosure.
Figure 15B:
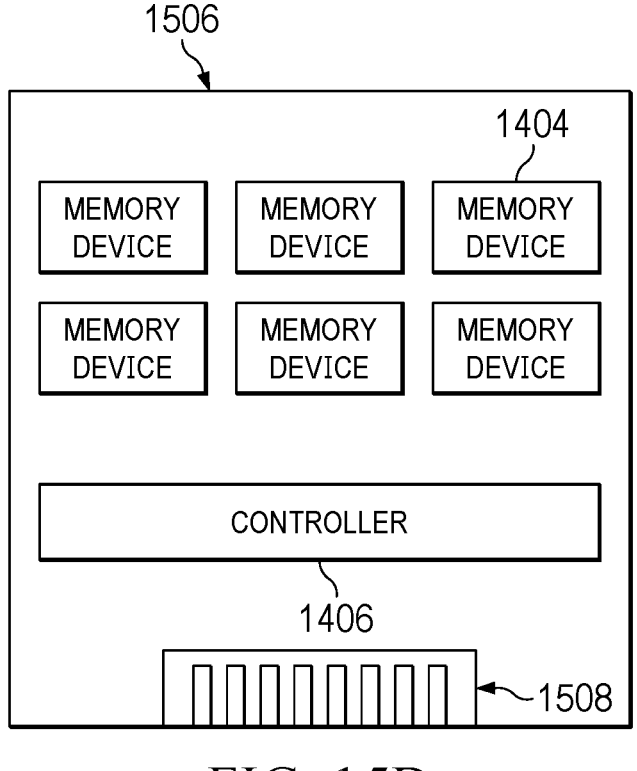
FIG. 15B illustrates a diagram of a solid-state drive (SSD) having a memory device. according to some aspects of the present disclosure.

Memory controller 1406 and one or more memory devices 1404 can be integrated into various types of storage devices, for example, be included in the same package, such as a universal Flash storage (UFS) package or an eMMC package. That is, memory system 1402 can be implemented and packaged into different types of end electronic products. In one example as shown in FIG. 15A, memory controller 1406 and a single memory device 1404 may be integrated into a memory card 1502. Memory card 1502 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1502 can further include a memory card connector 1504 coupling memory card 1502 with a host (e.g., host 1408 in FIG. 14). In another example as shown in FIG. 15B. memory controller 1406 and multiple memory devices 1404 may be integrated into an SSD 1506. SSD 1506 can further include an SSD connector 1508 coupling SSD 1506 with a host (e.g., host 1408 in FIG. 14). In some implementations, the storage capacity and/or the operation speed of SSD 1506 is greater than those of memory card 1502.

Certain aspects of the subject matter described here can be implemented as a memory device. The memory device includes a memory cell array and a leakage detection circuit. The memory cell array includes one or more planes of memory cells. The leakage detection circuit includes a first logic and a first resistor circuit. The first resistor circuit is coupled to a pump source and to a global word line, where the pump source is operable to provide power to the memory cell array. The first logic is coupled to the first resistor circuit. The first logic is configured to output a first signal indicating a current leakage status, where the current leakage status indicates whether a leakage current exists in a word line coupled to a memory cell of the memory cell array.

The memory device can include one or more of the following features.

In some implementations, the pump source is operable to provide a first voltage to the global word line through a voltage regulator during an incremental step pulse programming (ISPP) operation.

In some implementations, the first resistor circuit is positioned between the voltage regulator and the global word line.

In some implementations, the first resistor circuit is positioned between the pump source and the global word line.

In some implementations, the pump source is operable to provide a second voltage to the global word line during a program verify operation.

In some implementations, the first logic is configured to output the first signal based on a voltage over the first resistor circuit.

In some implementations, the first resistor circuit includes multiple resistors, each of the multiple resistors corresponds to a respective transistor, and the first resistor circuit is configured to select a combination of the multiple resistors based on inputs to the transistors.

In some implementations, the current leakage status indicates that the leakage current exists if a voltage over the combination of the multiple resistors is larger than or equal to a threshold, and the current leakage status indicates that the leakage current does not exist if the voltage over the combination of the multiple resistors is smaller than the threshold.

In some implementations, the leakage detection circuit further comprises a second resistor circuit that is coupled to the pump source and the first logic, and the second resistor circuit is configured to be set to a preset threshold value of resistance.

In some implementations, the leakage detection circuit further includes a second logic, the second logic is coupled to the first logic, and the second logic is configured to receive a second signal indicating a programming status and to output a third signal indicating a combined programming status.

In some implementations, the second logic includes an OR gate.

In some implementations, the combined programming status indicates that a program operation fails if the programming status indicates a failure of the program operation or the current leakage status indicates that the leakage current exists.

In some implementations, the memory device further includes a third logic that is coupled to the first logic and the second logic, and the third logic is configured to select an input signal to the second logic based on a preset value.

Certain aspects of the subject matter described here can be implemented as a memory system. The memory system includes a memory device and a controller. The memory device includes a memory cell array and a leakage detection circuit. The memory cell array includes one or more planes of memory cells. The leakage detection circuit is coupled with the memory cell array, where the leakage detection circuit is configured to output a signal to indicate whether a leakage current exists in the memory cell array. The controller is coupled to the memory device, where the controller is configured to perform operations including initiating a program operation for the memory cell array and receiving a first signal indicating that the leakage current exists in a word line in the memory cell array. In response to receiving the first signal, the memory device is configured to determine that the leakage current exists in a first block of the memory cell array and mark the first block as not usable.

The memory system can include one or more of the following features.

In some implementations, receiving the first signal indicating that the leakage current exists includes obtaining a status information of a register, where the status information indicates that the leakage current exists.

In some implementations, the memory cell array includes a first plane of memory cells and a second plane of memory cells.

In some implementations, the first block is in the first plane, a second block is in the second plane, the first signal indicates that the leakage current exists in at least one of the first block or the second block, and determining that the leakage current exists in the first block includes initiating a second program operation for the first block in the first plane, receiving a third signal indicating that the leakage current exists in the first block in response to initiating the second program operation, initiating a third program operation for the second block in the second plane, receiving a fourth signal indicating that the leakage current does not exist in the second block in response to initiating the third program operation, and determining that the leakage current exists in the first block based on the third signal and the fourth signal.

In some implementations, the second program operation and the third program operation are performed by using a preset data value.

In some implementations, after determining that the leakage current exists in the first block and before marking the first block as not usable, the operations further include sending a second signal to the memory device to move data from the first block to another block of the memory cell array.

Certain aspects of the subject matter described here can be implemented as a method for operating a memory system that includes a memory device and a controller coupled to the memory device. The method includes initiating, by the controller, a program operation for a memory cell array of the memory device. A leakage detection of the memory cell array is initiated by the controller. A first signal indicating that a leakage current exists in a word line in the memory cell array is received by the controller. In response to receiving the first signal, the controller determines that the leakage current exists in a first block of the memory cell array. The first block is marked by the controller as not usable.

The method for operating the memory system can include one or more of the following features.

In some implementations, after determining that the leakage current exists in the first block and before marking the first block as not usable, the method further includes sending a second signal to the memory device to move data from the first block to another block of the memory cell array.

In some implementations, the memory cell array includes a first plane of memory cells and a second plane of memory cells, the first block is in the first plane, a second block is in the second plane, the first signal indicates that the leakage current exists in at least one of the first block or the second block, and determining that the leakage current exists in the first block includes initiating a second program operation for the first block in the first plane, receiving a third signal indicating that the leakage current exists in the first block in response to initiating the second program operation, initiating a third program operation for the second block in the second plane, receiving a fourth signal indicating that the leakage current does not exist in the second block in response to initiating the third program operation, and determining that the leakage current exists in the first block based on the third signal and the fourth signal.

Certain aspects of the subject matter described here can be implemented as a method for operating a memory device. The method includes performing a program operation. A leakage detection is performed. Performing the leakage detection includes comparing a voltage over a combination of one or more resistors with a preset threshold during the program operation, where the one or more resistors are positioned between a pump source and a global word line in the memory device, determining that the voltage is larger than or equal to the preset threshold, and indicating that a leakage current exist in a word line coupled to a memory cell in the memory device in response to determining that the voltage is larger than or equal to the preset threshold.

The method for operating the memory device can include one or more of the following features.

In some implementations, the program operation includes an incremental step pulse programming (ISPP) operation. Performing the leakage detection further includes performing the leakage detection during a first ISPP pulse phase and after a variation of current of the global word line in the memory device during a preset period of time is less than a preset value.

In some implementations, the program operation includes a program verify operation. Performing the leakage detection further includes performing the leakage detection during a program verify pulse phase and after a variation of current of the global word line in the memory device during a preset period of time is less than a preset value.

In some implementations, the program operation includes an incremental step pulse programming (ISPP) operation, and the pump source is operable to provide a first voltage to a leakage detection circuit of the memory device through a voltage regulator.

In some implementations, the program operation includes a program verify operation, and the pump source is operable to provide a second voltage to a leakage detection circuit of the memory device.

Certain aspects of the subject matter described in this disclosure can be implemented as a non-transitory computer-readable medium storing one or more instructions executable by a computer system to perform operations including initiating, by a controller of a memory system, a program operation for a memory cell array, where the memory system includes a memory device, and the memory device includes the memory cell array. A leakage detection of the memory cell array is initiated by the controller. A first signal indicating that a leakage current exists in a word line in the memory cell array is received by the controller. In response to receiving the first signal, the controller determines that the leakage current exists in a first block of the memory cell array. The first block is marked by the controller as not usable.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A memory device, comprising:
a memory cell array, wherein the memory cell array comprises one or more planes of memory cells; and a leakage detection circuit, comprising:
a first logic; and
a first resistor circuit;
wherein:
the first resistor circuit comprises a first end coupled to a pump source and a second end coupled to a global word line, wherein the pump source is operable to provide power to the memory cell array;
the first logic comprises:
a first input coupled to the first end of the first resistor circuit; and
a second input coupled to the global word line; and
the first logic is configured to output a first signal indicating a current leakage status, wherein the current leakage status indicates whether a leakage current exists in a word line coupled to a memory cell of the memory cell array, the word line being coupled to the global word line, and
wherein the first resistor circuit comprises a plurality of selectable resistors, each corresponding to a respective transistor, and the first logic is configured to compare a voltage across a selected combination of the plurality of selectable resistors to a preset threshold during a program operation, and to output the first signal if the voltage exceeds the preset threshold during a programming phase and after a variation of a current of the global word line during a preset period of time is less than a preset value.

2. The memory device according to claim 1, wherein the pump source is operable to provide a first voltage to the global word line through a voltage regulator during an incremental step pulse programming (ISPP) operation.

3. The memory device according to claim 2, wherein the first resistor circuit is coupled between the voltage regulator and the global word line.

4. The memory device according to claim 1, wherein the first resistor circuit is coupled between the pump source and the global word line.

5. The memory device according to claim 1, wherein the pump source is operable to provide a second voltage to the global word line during a program verify operation.

6. The memory device according to claim 1, wherein the current leakage status indicates that the leakage current exists if the voltage over the combination of the plurality of resistors is larger than or equal to the preset threshold, and the current leakage status indicates that the leakage current does not exist if the voltage over the combination of the plurality of resistors is smaller than the preset threshold.

7. The memory device according to claim 1, wherein the leakage detection circuit further comprises a second resistor circuit that is coupled to the pump source and the first logic, and the second resistor circuit is configured to be set to a preset threshold value of resistance.

8. The memory device according to claim 1, wherein the leakage detection circuit further comprises a second logic, the second logic is coupled to the first logic, and the second logic is configured to:
receive a second signal indicating a programming status; and
output a third signal indicating a combined programming status.

9. The memory device according to claim 8, wherein the second logic comprises an OR gate.

10. The memory device according to claim 8, wherein the combined programming status indicates that a program operation fails if the programming status indicates a failure of the program operation or the current leakage status indicates that the leakage current exists.

11. The memory device according to claim 8, further comprising a third logic that is coupled to the first logic and the second logic, and the third logic is configured to select an input signal to the second logic based on a preset value.

12. A memory system, comprising:
  a memory device, comprising:
    a memory cell array, wherein the memory cell array comprises one or more planes of memory cells; and
    a leakage detection circuit coupled with the memory cell array, wherein the leakage detection circuit is configured to output a signal to indicate whether a leakage current exists in the memory cell array, and wherein the leakage detection circuit comprises a logic and a resistor circuit, the resistor circuit comprises a first end coupled to a pump source and a second end coupled to a global word line, and the logic comprises a first input coupled to the first end of the resistor circuit and a second input coupled to the global word line, wherein the resistor circuit comprises a plurality of selectable resistors, each corresponding to a respective transistor, and the logic is configured to compare a voltage across a selected combination of the plurality of selectable resistors to a preset threshold during a program operation, and to output the signal if the voltage exceeds the preset threshold during a programming phase and after a variation of a current of the global word line during a preset period of time is less than a preset value; and
  a controller coupled to the memory device, wherein the controller is configured to perform operations comprising:
    initiating a program operation for the memory cell array;
    receiving a first signal from the logic of the leakage detection circuit, the first signal indicating that the leakage current exists in a word line in the memory cell array, the word line being coupled to the global word line;
    in response to receiving the first signal, determining that the leakage current exists in a first block of the memory cell array, the first block comprising the word line; and
    marking the first block as not usable.

13. The memory system according to claim 12, wherein receiving the first signal indicating that the leakage current exists comprises obtaining status information of a register, and wherein the status information indicates that the leakage current exists.

14. The memory system according to claim 12, wherein the memory cell array comprises a first plane of memory cells and a second plane of memory cells.

15. The memory system according to claim 14, wherein the first block is in the first plane, a second block is in the second plane, the first signal indicates that the leakage current exists in at least one of the first block or the second block, and determining that the leakage current exists in the first block comprises:
    initiating a second program operation for the first block in the first plane;

in response to initiating the second program operation, receiving a third signal indicating that the leakage current exists in the first block;
    initiating a third program operation for the second block in the second plane;
    in response to initiating the third program operation, receiving a fourth signal indicating that the leakage current does not exist in the second block; and
    based on the third signal and the fourth signal, determining that the leakage current exists in the first block.

16. The memory system according to claim 12, wherein the leakage detection circuit further comprises a second resistor circuit that is coupled to the pump source and the first logic, and the second resistor circuit is configured to be set to a preset threshold value of resistance.

17. The memory system according to claim 12, wherein the leakage detection circuit further comprises:
    a second logic, the second logic is coupled to the first logic, and the second logic is configured to: receive a second signal indicating a programming status, and output a third signal indicating a combined programming status; and
    a third logic that is coupled to the first logic and the second logic and configured to select an input signal to the second logic based on a preset value.

18. A method for operating a memory device, comprising:
    performing a program operation of the memory device; and
    performing a leakage detection during a programming phase in the program operation and after a variation of a current of a global word line during a preset period of time is less than a preset value;
    wherein performing the leakage detection comprises:
      comparing a voltage over a combination of one or more resistors of a resistor circuit with a preset threshold during the program operation by a logic, wherein the resistor circuit comprises a first end coupled to a pump source and a second end coupled to the global word line in the memory device, and the logic has a first input coupled to the first end of the resistor circuit and a second input coupled to the global word line;
      determining that the voltage is larger than or equal to the preset threshold; and
      in response to determining that the voltage is larger than or equal to the preset threshold, outputting a signal indicating that a leakage current exist in a word line coupled to a memory cell in the memory device, the word line being coupled to the global word line.

19. The method according to claim 18, wherein:
    the program operation comprises an incremental step pulse programming (ISPP) operation; and
    the programming phase comprises a first ISPP pulse phase in the ISPP operation.

20. The method according to claim 18, wherein:
    the program operation comprises a program verify operation; and
    the programming phase comprises a program verify pulse phase in the program verify operation.

\* \* \* \* \*